United States Patent [19]
Inazawa et al.

[11] Patent Number: 5,595,627
[45] Date of Patent: Jan. 21, 1997

[54] PLASMA ETCHING METHOD

[75] Inventors: Koichiro Inazawa, Tokyo; Shin Okamoto, Kofu; Hisataka Hayashi, Yokohama; Takaya Matsushita, Yokkaichi, all of Japan

[73] Assignees: Tokyo Electron Limited, Tokyo; Kabushiki Kaisha Toshiba, Kawasaki, both of Japan

[21] Appl. No.: 597,563

[22] Filed: Feb. 2, 1996

[30] Foreign Application Priority Data

Feb. 7, 1995 [JP] Japan .................................. 7-043532

[51] Int. Cl.$^6$ ........................... H01L 21/00; C09K 13/00
[52] U.S. Cl. .................... 156/643.1; 156/646.1; 156/662.1; 252/79.1
[58] Field of Search .................. 156/643.1, 626.1, 156/662.1

[56] References Cited

U.S. PATENT DOCUMENTS 5,338,399  8/1994  Yanagida .

Primary Examiner—R. Bruce Breneman
Assistant Examiner—Michael E. Adjodha
Attorney, Agent, or Firm—Oblon, Spivak, McClelland, Maier & Neustadt, P.C.

[57] ABSTRACT

A plasma etching apparatus has a lower electrode for supporting a semiconductor wafer in a processing room, an upper electrode opposite to the lower electrode, and an RF power supply for applying an RF power across the upper and lower electrodes. An SiN layer as an underlayer having a shoulder portion, and an $SiO_2$ layer covering the SiN layer are disposed on the wafer. A contact hole is formed in the $SiO_2$ layer by etching so as to expose the shoulder portion of the SiN layer. A processing gas contains $C_4F_8$ and CO. To set the etching selection ratio of $SiO_2$/SiN, the discharge duration of each part of the processing gas is used as a parameter. The progress of dissociation of $C_4F_8$ is controlled by selecting the discharge duration. The discharge duration is determined by the residence time of each part of the processing gas and the application time of an RF power.

18 Claims, 7 Drawing Sheets

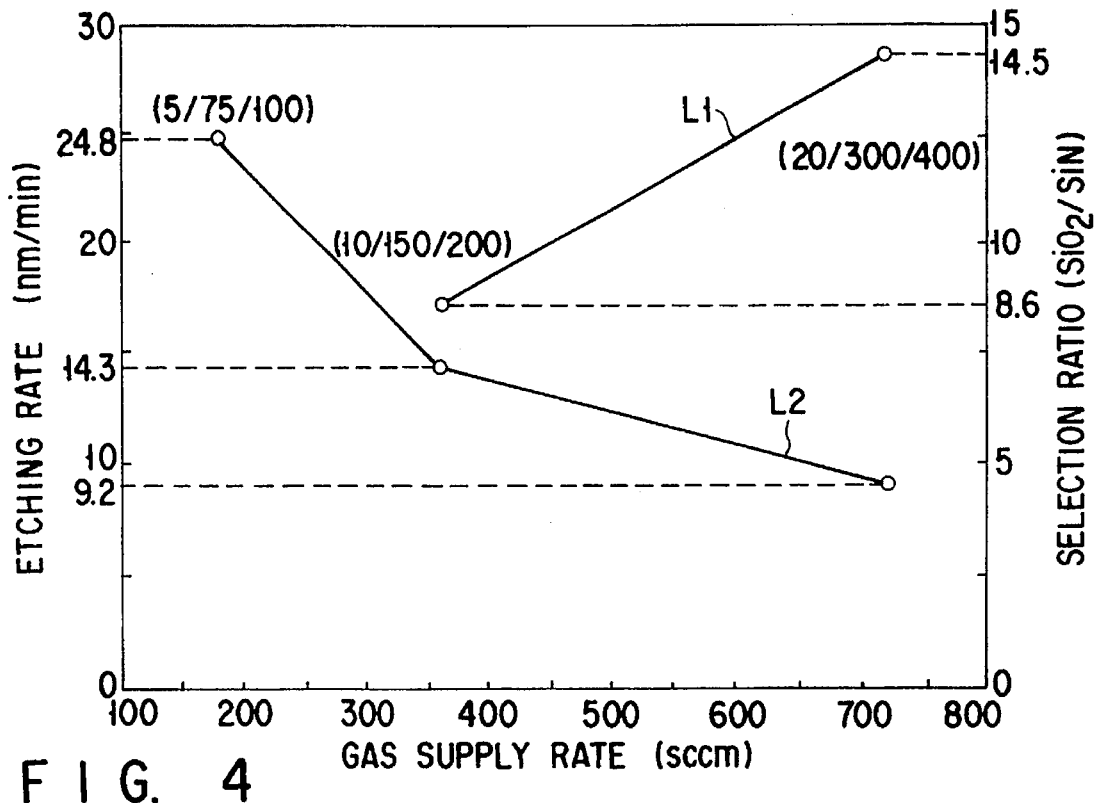
F I G. 4
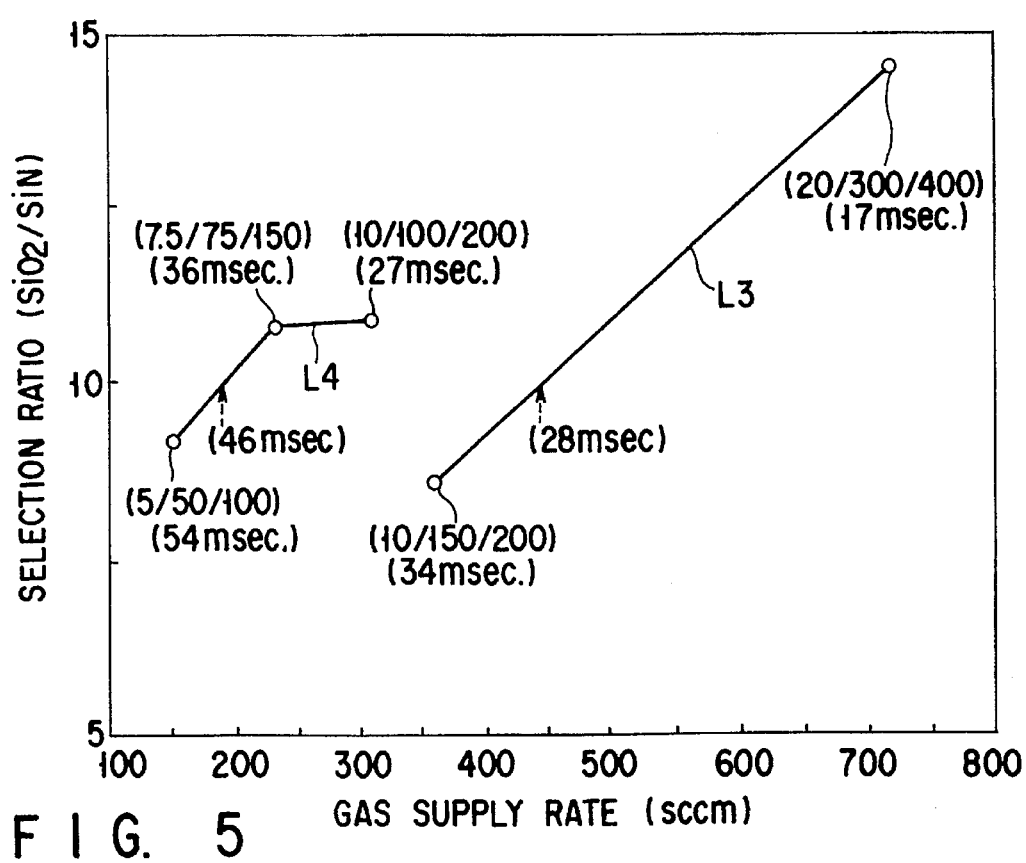
F I G. 5

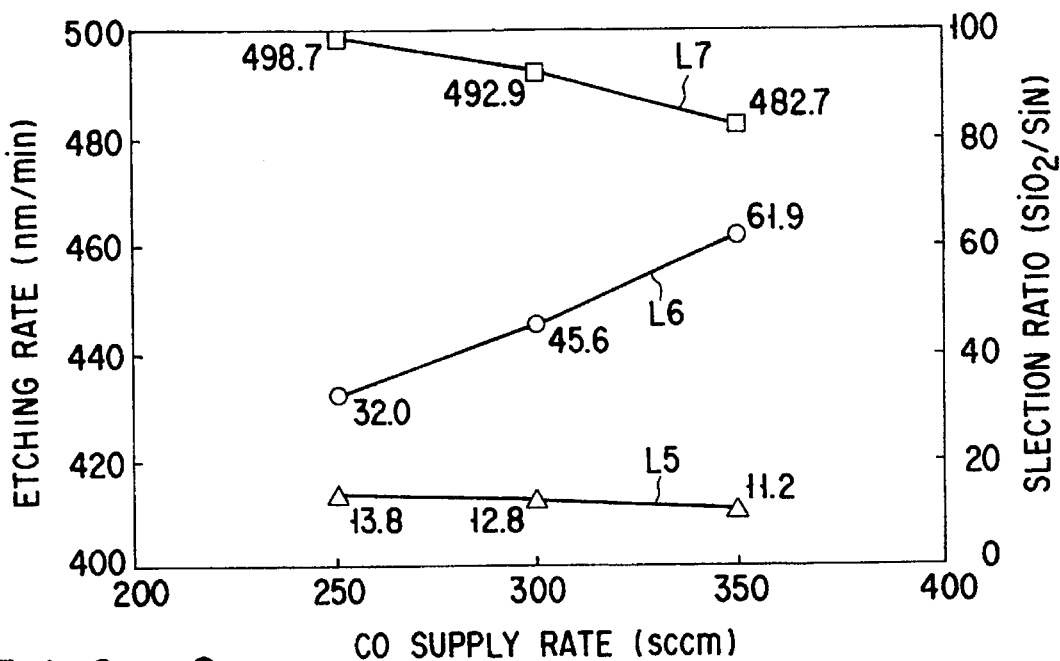
F I G. 8
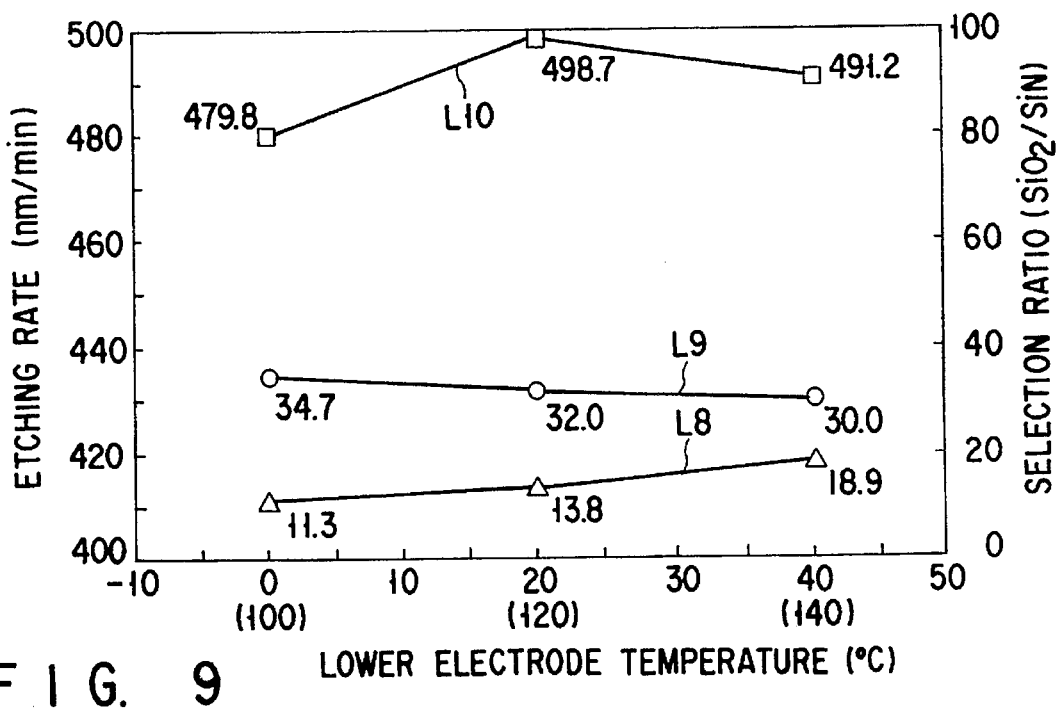
F I G. 9

PLASMA ETCHING METHOD

BACKGROUND OF THE INVENTION

1. Field of the Invention

The present invention relates to a plasma etching method and, more particularly, to a method of etching an $SiO_2$ layer at a high selection ratio relative to an SiN layer.

2. Description of the Related Art

To manufacture a semiconductor device, etching for forming a desired fine pattern on a thin film stacked on a wafer is used.

When a contact hole or a circuit pattern is to be formed by etching in a thin $SiO_2$ film as a typical insulating material for a device, a dry etching method of performing etching in a plasma atmosphere is used. In this method, a gas mixture including $H_2$ such as $CF_4+H_2$ gas, or a gas mixture of a $CH_xF_y$-based gas having H bonds and $CO_2$ or CO gas such as $CH_2F_2+CO_2$ gas or $CHF_3+CO$ gas is used as an etching gas.

To perform etching, it is preferable that the selection ratio of an etching target layer to be etched to an underlayer therebelow, i.e., the ratio of the etching rate of the etching target layer to that of the underlayer be as high as possible.

By using the above-described gas mixture of a $CH_xF_y$-based gas and $CO_2$ or CO gas as an etching gas, the selection ratio can be increased to 10 or more higher than that using a single $CH_xF_y$-based gas.

With micropatterning and high integration of semiconductor devices, a wiring width and an interval between adjacent gates of FETs (Field Effect Transistor) have been decreased. Thus, the dimensional accuracy of a lithography technique of forming a contact hole in the source/drain of an FET is more strongly demanded.

As a technique of forming a semiconductor device with a high dimensional accuracy, a so-called self-alignment method is known. In this method, contact holes are formed in an insulating interlayer along a gate electrode, using the gate electrode, covered with a protection film, itself as a mask pattern. Note that typical materials for the insulating interlayer and the protective insulating film are $SiO_2$ and SiN, respectively.

In forming a contact hole, therefore, an $SiO_2$ insulating interlayer is etched (to be described later with reference to FIG. 7). At this time, a shoulder or corner portion 5a of the SiN insulating film is etched from two directions, i.e., from the upper and lateral directions, so that the corner portion is more easily eroded. For this reason, the etching selection ratio decreases at the corner portion 5a even under a condition for assuring a sufficiently high etching selection ratio ($SiO_2$/SiN) at a flat portion 5b. The decrease in etching selection ratio generates openings in the SiN insulating film to cause problems such as short-circuiting of the gate electrode upon completion of the device.

The selection ratios also decrease at corner portions, or shoulder portions of not only an SiN underlayer but also an underlayer consisting of Si, Al, TiN, TiSi, W, WSi, or the like.

SUMMARY OF THE INVENTION

It is an object of the present invention to provide a plasma etching method capable of sufficiently increasing the etching selection ratio (etching target layer/underlayer).

From the results of the study, the present inventors have found that generated radicals and their ratio change in accordance with different discharge durations of a processing gas, and a larger number of radicals which contribute to etching at a high selection ratio are generated for a shorter discharge duration.

According to a first aspect of the invention, there is provided a plasma etching method in which a processing gas is introduced into a processing room housing a substrate, an RF power is applied across opposite electrodes to cause the processing gas to discharge, thereby generating a plasma, and a first layer supported by the substrate is etched by using the plasma in preference to a second layer supported by the substrate and consisting of a material different from that of the first layer, Wherein the first layer consists essentially of $SiO_2$ while second layer consists essentially of a material selected from a group consisting of SiN, Si, Al, and TiN, the processing gas contains $C_4F_8$ and CO, and progress of dissociation of $C_4F_8$ is controlled, using a discharge duration of each part of the processing gas as a parameter, in order to set an etching selection ratio of the first layer to the second layer.

According to a second aspect of the present invention, there is provided a plasma etching method in which a processing gas is introduced into a processing room housing a substrate, an RF power is applied across opposite electrodes to cause the processing gas to discharge, thereby generating a plasma, and a first layer supported by the substrate is etched by using the plasma in preference to a second layer supported by the substrate and consisting of a material different from that of the first layer, wherein the first layer consists essentially of $SiO_2$ while the second layer consists essentially of a material selected from a group consisting of SiN, Si, Al, TiN, W, WSi, and TiSi, the processing gas contains $C_4F_8$ and CO, and a density ratio of $C_2F_4$ and $CF_3$, which are generated upon dissociation of $C_4F_8$, is controlled, using a discharge duration of each part of the processing gas as a parameter, in order to set an etching selection ratio of the first layer to the second layer.

According to a third aspect of the present invention, there is provided a plasma etching method using a plasma etching apparatus in which a first layer supported by a substrate is etched in preference to a second layer supported by the substrate and consisting of a material different from that of the first layer, wherein the apparatus comprises a first electrode for supporting the substrate in a processing room, a second electrode opposite to the first electrode in the processing room, and an RF power supply for applying an RF power across the first and second electrodes, and wherein the first layer consists essentially of $SiO_2$ while the second layer consists essentially of a material selected from a group consisting of SiN, Si, Al, TiN, W, WSi, and TiSi, the processing gas contains $C_4F_8$ and CO, the method comprising the steps of:
selecting a value for a discharge duration of each part of a processing gas as a parameter in order to set an etching selection ratio of the first layer to the second layer, a density ratio of $C_2F_4$ to $CF_3$, which are generated upon dissociation of $C_4F_8$, being controlled by changing the discharge duration;
setting the plasma etching apparatus in accordance with the selected value of the parameter;
supporting the substrate by the first electrode;

supplying the processing gas into the processing room while exhausting the processing room, the processing gas containing $C_4F_8$ and CO;

applying the RF power across the first and second electrodes to convert the processing gas into a plasma; and processing the first and second layers using the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a graph showing the relationship between the total supply rate of a processing gas, the etching selection ratio ($SiO_2$/SiN) at a shoulder portion, and the SiN etching rate at a flat portion in the apparatus shown in FIG. 1;

FIG. 5 is a graph showing the relationship between the total supply rates of processing gases and the etching selection ratios ($SiO_2$/SiN) at shoulder portions in the apparatuses shown in FIGS. 1 and 3;

FIG. 8 is a graph showing the relationship between the CO supply rate and the etching selection ratio ($SiO_2$/SiN) in the apparatus shown in FIG. 1;

FIG. 9 is a graph showing the relationship between the temperature of a lower electrode and the etching selection ratio ($SiO_2$/SiN) in the apparatus shown in FIG. 1.

DETAILED DESCRIPTION OF THE PREFERRED EMBODIMENTS

Figure 1:
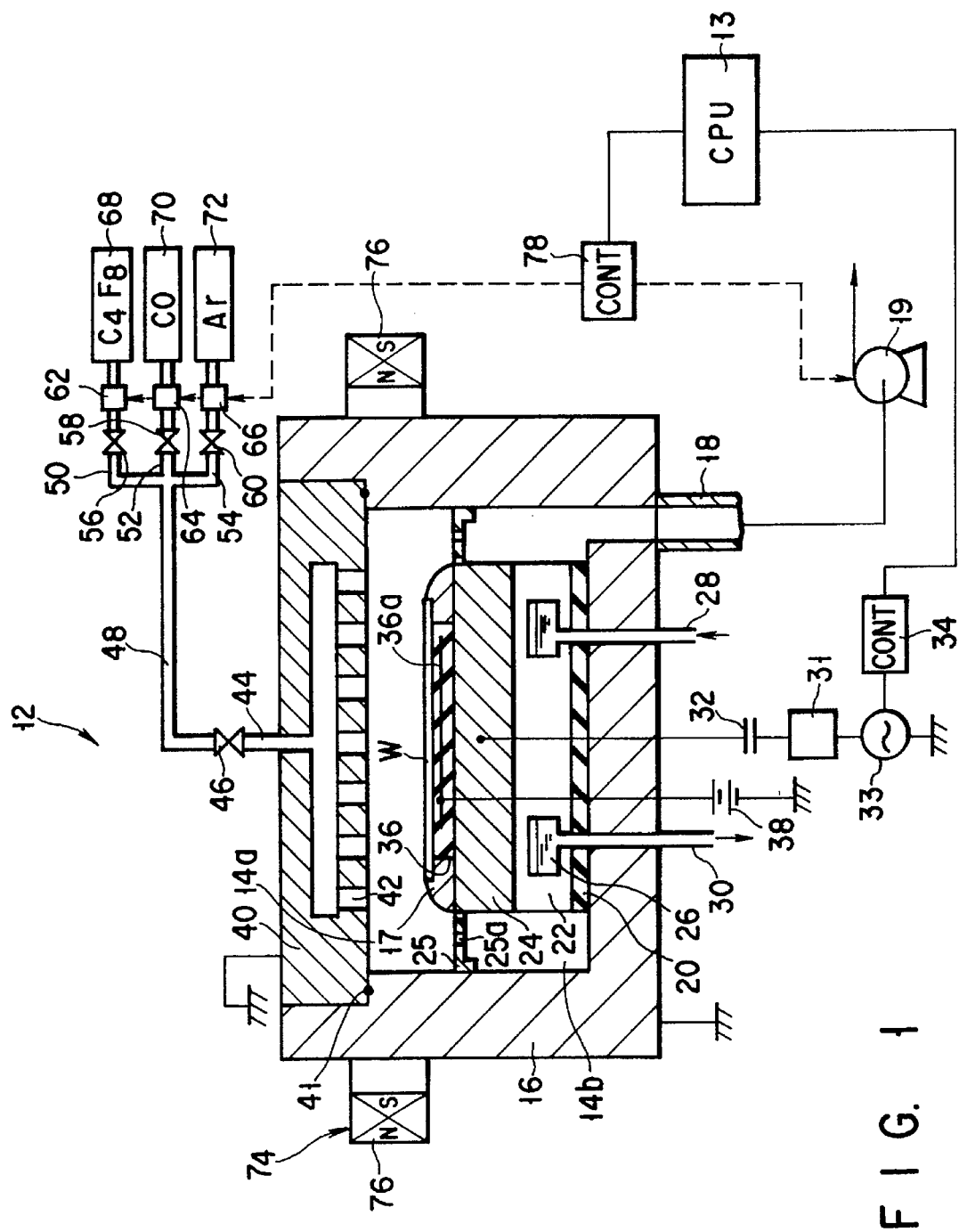
FIG. 1 is a sectional view showing a dipole ring type magnetron plasma etching apparatus according to the present invention.

A dipole ring type magnetron plasma etching apparatus 12 shown in FIG. 1 has an airtight processing chamber 16 consisting of, e.g., aluminum. A susceptor support base 22 consisting of, e.g., aluminum is disposed at the center of the bottom portion in the processing chamber 16 through an insulating plate 20 consisting of, e.g., ceramic. A susceptor 24 is disposed as a lower electrode consisting of, e.g., aluminum on the support base 22.

An exhaust ring 25 consisting of, e.g., aluminum is disposed around the susceptor 24. The interior of the processing chamber 16 is partitioned by the susceptor 24 and the exhaust ring 25 into an upper processing room, i.e., a discharge room 14a, and a lower auxiliary room 14b. A large number of holes 25a are formed in the exhaust ring 25 at an equal interval to cause the discharge room 14a to communicate with the auxiliary room 14b.

An exhaust pipe 18 in which a vacuum pump 19 having a controllable exhaust amount is interposed is connected to the bottom portion of the processing chamber 16. The interior of the processing room 14a is uniformly evacuated by the vacuum pump 19 through the auxiliary room 14b. The capacity of the discharge room 14a is set to, e.g., about 3.5 liters.

A room 26 for introducing a cold or heat medium is formed in the susceptor support base 22. A medium feed pipe 28 and a medium exhaust pipe 30 which extend through the bottom portion of the processing chamber 16 are connected to the room 26.

An electrostatic chuck 36 for attracting and chucking a semiconductor wafer W serving as a target object is disposed on the upper surface of the susceptor 24. The electrostatic chuck 36 is constituted by, e.g., a copper foil 36a and polyimide films which interpose the copper foil 36a. A high-voltage DC power supply 38 is connected to the copper foil 36a. When an DC voltage is applied to the copper foil 36a, the wafer W is chucked by a Coulomb force to the surface of the chuck 36.

A focus ring 17, made of a conductive or insulating material, is disposed on the susceptor 24 so as to surround the wafer W serving as a target object. The focus ring 17 facilitates etching to be uniformly performed at every part on the wafer W. Although the thick focus ring 17 and the thick electrostatic chuck 36 are illustrated in FIG. 1, they are as thin as the wafer W in practice.

An RF power supply 33 of, e.g., 13.56 MHz for generating plasma is connected to the susceptor 24 through a matching circuit 31 and a blocking capacitor 32. The output from the RF power supply 33 is adjusted by an output control section 34 connected to a CPU 13. Under the control of the control section 34, an RF power is applied continuously or in pulsation from the RF power supply 33 to the susceptor 24 (to be described later).

The ceiling portion of the processing chamber 16 is defined by an upper electrode 40. A portion between the side wall and ceiling portion of the processing chamber 16 are sealed by a seal member 41 constituted by, e.g., an O-ring. The upper electrode 40, the side wall of the processing chamber 16, and the exhaust ring 25 are grounded. Therefore, when an RF power is applied to the susceptor 24 to form an RF electric field in the processing room 14a, the susceptor 24 functions as a cathode electrode, and the members 40, 16, and 25 function as an anode electrode.

The upper electrode 40 consists of a conductive material such as amorphous carbon, SiC, or Al. The upper electrode 40 has a shower head structure. More specifically, the upper electrode 40 has a hollow interior, and a large number of gas diffusion holes 42 are formed in its entire surface opposite to the wafer W. A dispensing plate (not shown) is disposed in the upper electrode 40. An etching gas fed into the upper electrode 40 through a gas feed pipe 44 is uniformly sprayed into the processing chamber 16 through the gas diffusion holes 42.

A gas supply pipe 48 in which a valve 46 is interposed is connected to the gas feed pipe 44. The distal end of the gas supply pipe 48 is branched into three branch pipes 50, 52, and 54. Gas sources 68, 70, and 72 for different gases are connected to the branch pipes 50, 52, and 54 through valves 56, 58, and 60, and massflow controllers 62, 64, and 66 for controlling the flow rates, respectively. In this apparatus, the gas sources 68, 70, and 72 are filled with $C_4F_8$, CO, and Ar gases, respectively. Further, $N_2$ and $O_2$ gases, and the like may be added to a processing gas.

The flow rates of the massflow controllers 62, 64, and 66 are controlled by a control section 78 constituted by, e.g., a microcomputer connected to the CPU 13. The control section 78 also controls the exhaust amount of the vacuum pump 19.

A ring-like dipole ring 74 is disposed around the outer side wall of the processing chamber 16 at a slight interval. The dipole ring 74 can be rotated by a driving member (not shown) in the circumferential direction at, e.g., 20 rpm.

Figure 2:
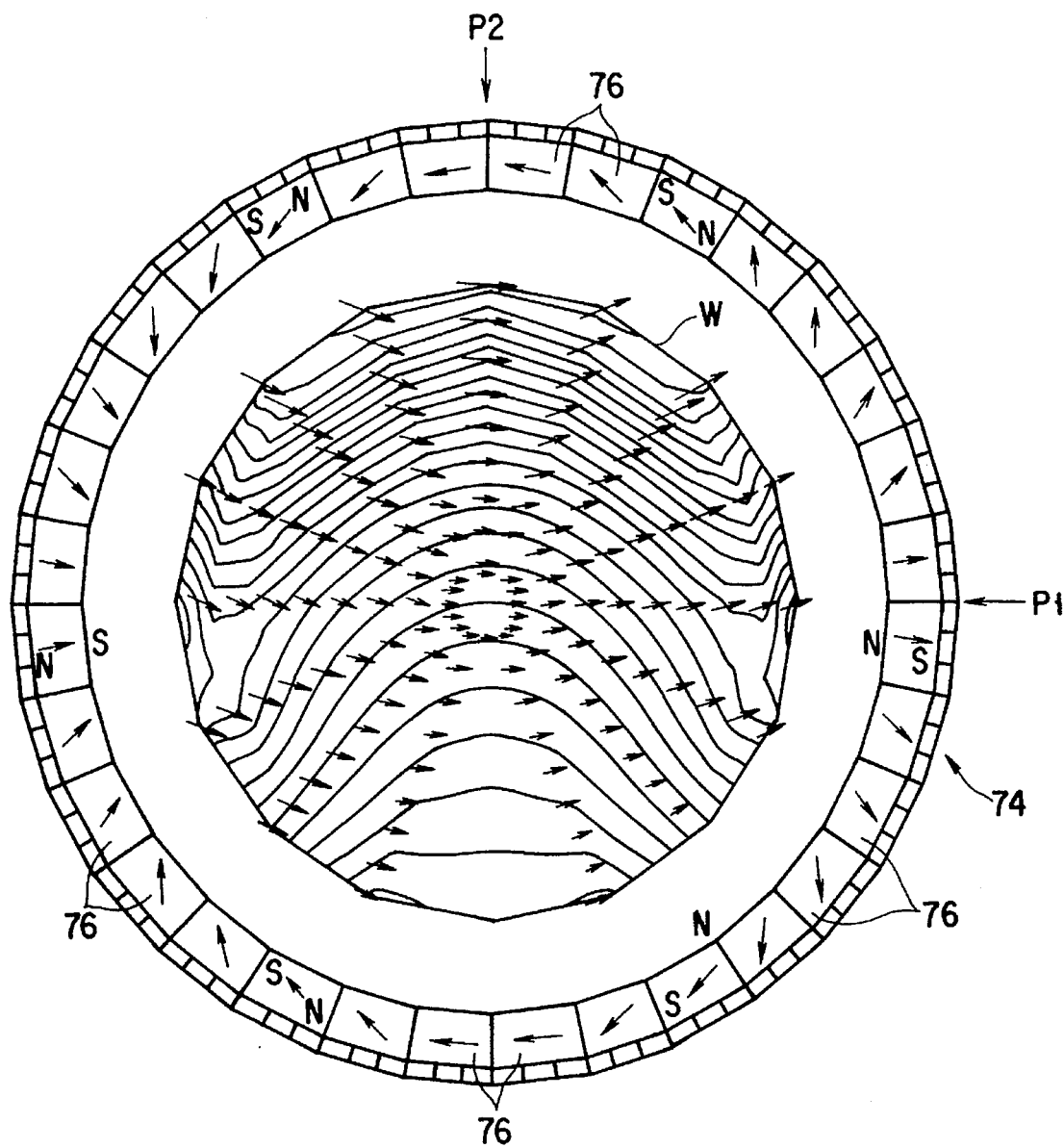
FIG. 2 is a plan view showing the relationship between the arrangement of permanent magnets and the direction of a magnetic field in the apparatus shown in FIG. 1.

The dipole ring 74 is constituted by a large number of small permanent magnet pieces 76 which are coupled to each other in a ring shape, as shown in FIG. 2. The magnet pieces 76 are arrayed such that the magnetizing direction (indicated by arrows in the magnet pieces 76) turns twice around the ring 74. A pair of magnet pieces 76 which oppose each other about the center of the ring 74 have the same magnetizing direction.

In FIG. 2, arrows illustrated on the wafer W indicate the directions of magnetic fields, and curves on the wafer W indicate the magnetic lines of constant force. The magnetic field on the wafer W is parallel to the target surface of the wafer W, and its magnetic force becomes stronger on point P2. For example, in this apparatus, a magnetic field having about 120 G is generated.

Figure 3:
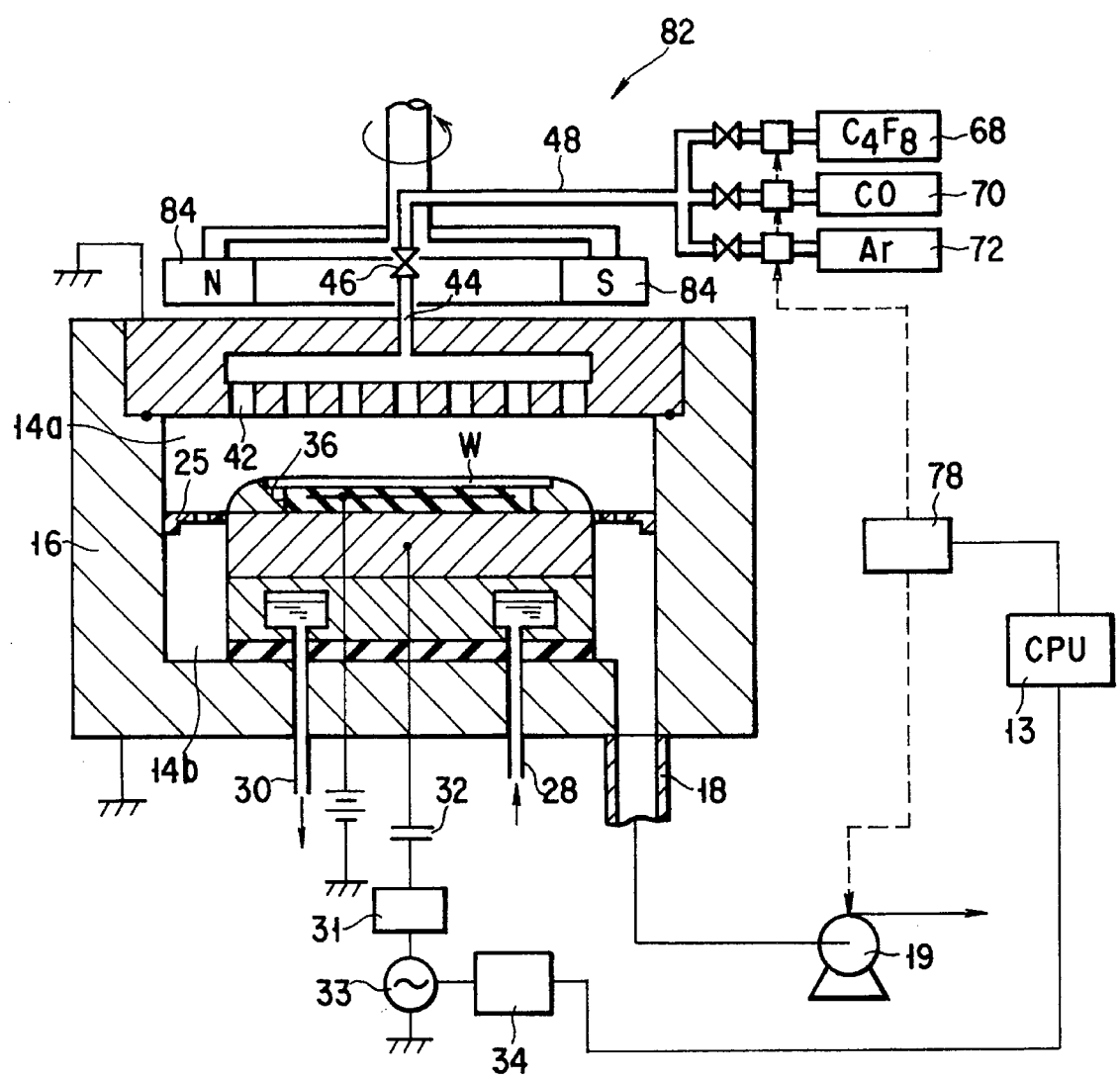
FIG. 3 is a sectional view showing a bar magnet type magnetron plasma etching apparatus according to the present invention.

A method according to the present invention (to be described later) can be applied to a plasma etching apparatus of another type such as a bar magnet type magnetron plasma etching apparatus as shown in FIG. 3 as well as the dipole ring type magnetron etching apparatus as shown in FIG. 1.

A bar magnet type magnetron plasma etching apparatus 82 shown in FIG. 3 has an N-S type permanent bar magnet 84 disposed above the upper electrode 40 serving as the ceiling portion of the processing chamber 16. The bar magnet 84 is rotated by a driving member (not shown) to form a magnetic field above and parallel to the surface of the wafer W in the processing chamber 16. Since the remaining portions are practically identical to those in the apparatus shown in FIG. 1, the same reference numerals denote the same parts, and a detailed description thereof will be omitted.

A processing method in the magnetron plasma etching apparatuses shown in FIGS. 1 and 3 will be described below.

First of all, the semiconductor wafer W serving as a target object is loaded into the processing chamber 16 from a load-lock room (not shown) connected to the processing chamber 16 through a gate valve (not shown). The wafer W is placed on the electrostatic chuck 36, and a DC voltage is applied to the electrostatic chuck 36 to attract and chuck the wafer W to the chuck 36.

While the interior of the processing chamber 16 is evacuated by the pump 19, a processing gas, i.e., a gas mixture of $C_4F_8$, CO, and Ar is supplied from the gas sources 68, 70, and 72 into the processing room 14a. At this time, the flow rate of the processing gas is controlled (to be described later). In this manner, the interior of the processing chamber 16 is kept at a predetermined processing pressure, e.g., 20 mTorr.

While the processing gas is supplied, an RF power is applied across the upper electrode 40 and the susceptor 24 serving as a lower electrode to convert the processing gas into a plasma. The processing gas is converted into a plasma and gradually dissociated to generate various radicals. These radicals etch an etching target layer on the surface of the wafer to form, e.g., a contact hole.

Figure 7:
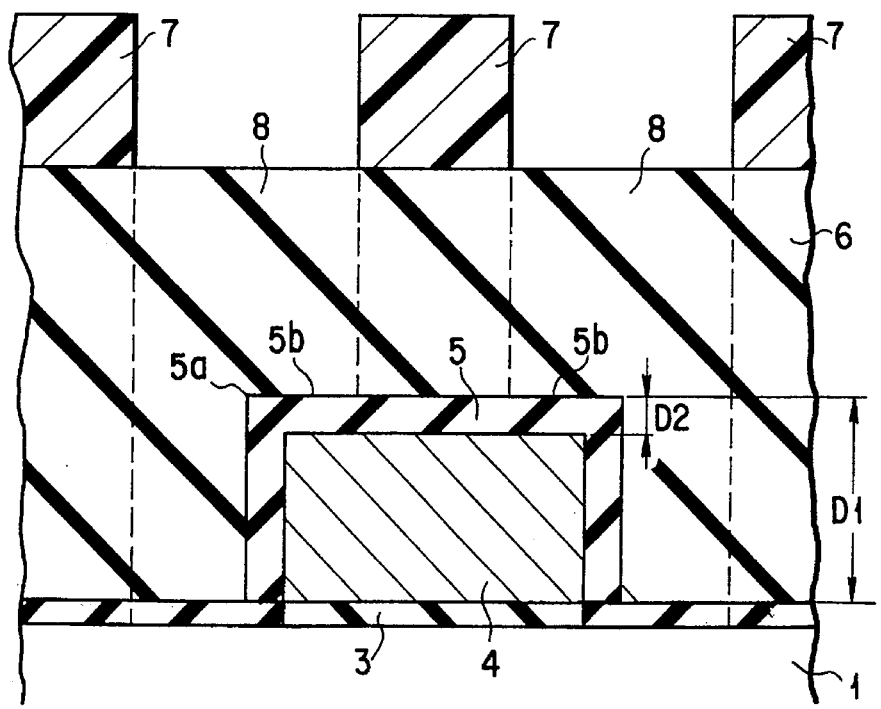
FIG. 7 is a sectional view showing a manner of forming contact holes by self alignment.

FIG. 7 shows a manner of forming contact holes by self alignment.

In FIG. 7, a gate electrode 4 is disposed on a substrate 1 through a gate insulating film 3. The gate electrode 4 is covered with an insulating film 5 consisting of SiN (silicon nitride). A thick $SiO_2$ insulating interlayer 6 is deposited on the gate structure. Contact holes 8 are formed by plasma-etching the insulating interlayer 6 at the two sides of the gate structure, using a patterned photoresist layer 7 as a mask, and $C_4F_8$/CO/Ar as a processing gas. At this time, a shoulder or corner portion 5a of the SiN insulating film 5 is etched from two directions, i.e., from the upper and lateral directions, so that the corner portion 5a is eroded more easily than the flat portion 5b of the insulating film 5. For this reason, the etching selection ratio is decreased at the shoulder portion or corner portion 5a even under a condition for assuring a sufficiently high etching selection ratio ($SiO_2$/SiN) at the flat portion.

For example, the etching selection ratio ($SiO_2$/SiN) is about 20 at the flat portion by using $C_4F_8$/CO/Ar as a processing gas without using the method of the present invention (to be described later). At the shoulder portion 5a, however, an etching selection ratio of 10 which is the target value of the present invention cannot be obtained. A decrease in etching selection ratio ($SiO_2$/SiN) generates openings in the SiN insulating film 5 to cause problems such as short-circuiting of the gate electrode upon completion of the device.

It is preferable an the gate structure that the gate electrode 4 be sufficiently thick, while the insulating film 5 be as thin as possible. For example, in FIG. 7, a thickness D1 of the gate structure including the SiN insulating film 5 is formed to be about 300 to 400 nm, and a thickness D2 of the SiN insulating film 5 is about 50 nm. Therefore, if an etching selection ratio ($SiO_2$/SiN) of at least 10 is assured at the shoulder portion of the gate structure, i.e., the shoulder portion 5a of the SiN insulating film 5 serving as an underlayer, the SiN insulating film 5 remains 10 to 20 nm in thickness to obtain insulating properties.

In the present invention, the selection ratio of an etching target layer ($SiO_2$) to its underlayer (SiN), and particularly the selection ratio at the corner portion or shoulder portion 5a of the underlayer (see FIG. 7) are set high. For this reason, the present inventors gave attention to the role of radicals which were obtained upon dissociation of a processing gas.

In general, upon application of an RF power to $C_4F_8$ gas, an etching gas is dissociated according to the following formulas with an increase in application time (discharge duration).

$C_4F_8 \rightarrow C_2F_4 \rightarrow CF_2 \rightarrow CF+F$ $C_4F_8 \rightarrow CF_3 \rightarrow CF_2+F$

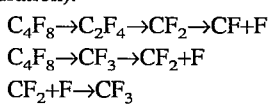

In the generated radicals (including ions), the reaction of F with Si is promoted with a high content of F to decrease the etching selection ratio. More specifically, $C_2F_4$ exhibits a relatively high etching selection ratio ($SiO_2$/SiN), while radicals such as $CF_3$ and F exhibit low etching selection ratios. That is, to increase the etching selection ratio ($SiO_2$/SiN), the $C_2F_4$ content must be increased.

For this reason, in the present invention, CO is contained in a processing gas, and F generated upon dissociation is reacted with CO to decrease the F content in the radicals. Furthermore, by adjusting the time when the processing gas is converted in a plasma, the progress of dissociation of the processing gas is controlled.

The processing method is described below in more detail. That is, the residence time of a processing gas in the processing room, i.e., the discharge room 14a is set to a predetermined value (e.g., 28 msec) or less with continuous application of an RF power. In order to achieve this, the total flow rate (supply rate) of the processing gas and the exhaust capacity are controlled by the control section 78.

Temperature management of a target object is important for performing processing for a high etching selection ratio ($SiO_2$/SiN). Processing for a high etching selection ratio can be performed by heating the wafer W to 80° C. to 150° C., and preferably to around 140° C. (temperature of the surface to be processed).

The residence time of a processing gas is represented by a simple equation: residence time=capacity of processing room 14a×pressure÷supply rate of processing gas. More specifically, the residence time is determined by the capacity of the processing room 14a, the supply rate of a processing gas, the exhaust amount of a pump, and the processing pressure. The control section 78 is set based on these parameters to control the supply rate of a processing gas and the exhaust rate.

By shortening the residence time of a processing gas in this manner, the discharge duration of the processing gas is shortened. As a result, the amount of radicals such as $C_2F_4$ offering a high selection ratio is increased, while the amount of radicals such as $CF_3$ and F offering small selection ratios is decreased, thereby increasing the etching selection ratio at the corner portion or shoulder portion 5a of the underlayer.

With continuous application of an RF voltage, continuous plasma discharge occurs in the processing room 14a. However, a processing gas is sequentially exchanged with a new gas after a predetermined residence time. Giving attention to a part of a processing gas fed at a given point, the period of plasma discharge at this part is almost equal to the residence time of this part in the processing room 14a. That is, the residence time of each part of a processing gas is the discharge duration of the part.

Next, the relationship between the residence time of a processing gas, the etching selection ratio ($SiO_2$/SiN), and the SiN etching rate will be described on the basis of FIGS. 4 and 5.

FIG. 4 is a graph showing experimental results in the dipole ring type etching apparatus shown in FIG. 1. FIG. 5 is a graph for comparing the experimental results in the dipole ring type apparatus shown in FIG. 1 to those in the bar magnet type apparatus shown in FIG. 3.

In experiments related to FIG. 4, the etching pressure was set at 40 mTorr; the RF power, 1,700 W; the temperatures of the ceiling portion and side wall of the processing chamber 16, 60° C.; and the temperature of the susceptor 24, 20° C.. The total supply rate of a processing gas and the exhaust rate were increased at a constant processing pressure and a constant composition ratio to decrease the residence time of the processing gas.

In FIG. 4, a line L1 indicates the etching selection ratio ($SiO_2$/SiN) at a shoulder portion with respect to the total supply rate of the processing gas, and a line L2 indicates the SiN etching rate at a flat portion with respect to the total supply rate of the processing gas. Figures in parentheses at each point indicate the flow rate (SCCM) of $C_4F_8$/CO/Ar processing gas.

In the experiments related to FIG. 4, as indicated by the line L1, the selection ratio was 8.6 at a total supply rate of 360 SCCM, and abruptly increased to 14.5 at a total supply rate of 720 SCCM. In addition, as indicated by the line L2, the SiN etching rate decreased at the flat portion with an increase in total supply rate.

In FIG. 5, a line L3 indicates the etching selection ratio ($SiO_2$/SiN) at a shoulder portion in the dipole ring type apparatus shown in FIG. 1, which is obtained by drawing the line L1 in FIG. 4 without any change. A line L4 indicates the etching selection ratio ($SiO_2$/SiN) at a shoulder portion in the bar magnet type apparatus shown in FIG. 3. Figures in upper parentheses at each point indicate the $C_4F_8$/CO/Ar flow rate (SCCM), as in FIG. 4, and figures in lower parentheses indicate the residence time (msec) of the processing gas in the processing room 14a.

In the dipole ring type apparatus shown in FIG. 1, as indicated by the line L3 in FIG. 5, the selection ratio greatly increases from 8.6 to 14.5 with a decrease in residence time of the processing gas from 34 msec to 17 msec, as described above. The residence time is set to 28 msec or less with the target value of the etching selection ratio of 10 or more at the shoulder portion as a reference. In addition, in the bar magnet type apparatus shown in FIG. 3, as indicated by the line L4, the residence time is set to 46 msec or less on the basis of the target value of the etching section ratio of 10 or more at the shoulder portion.

Although the processing pressure was set at 40 mTorr in the experiments related to FIGS. 4 and 5, the processing method according to the present invention can be applied at an etching pressure falling within a range equal to that of a normal etching pressure, e.g., within a range of several mTorr to several hundreds mTorr. Further, although the mixing ratio of $C_4F_8$, CO, and Ar gases was set at 1:15:20 in the dipole ring type apparatus, the processing method according to the present invention can be applied using a gas mixture having a mixing ratio of, e.g., about 1:2:0 to 1:30:40.

In the above etching method, to set the discharge duration of each part of a processing gas to a predetermined value, the residence time of the processing gas is adjusted with continuous application of an RF voltage. For this reason, the supply rate of the processing gas and the exhaust amount of the processing room 14a are controlled by the control section 78.

To the contrary, in an etching method to be described below, to set the discharge duration of each part of a processing gas to a predetermined value, the application time of an RF voltage is taken into consideration as a parameter in addition to the residence time of the processing gas. For this purpose, the RF power supply 33 is controlled by the control section 34 to apply an RF voltage in pulsation and adjust the pulse width.

Figure 6:
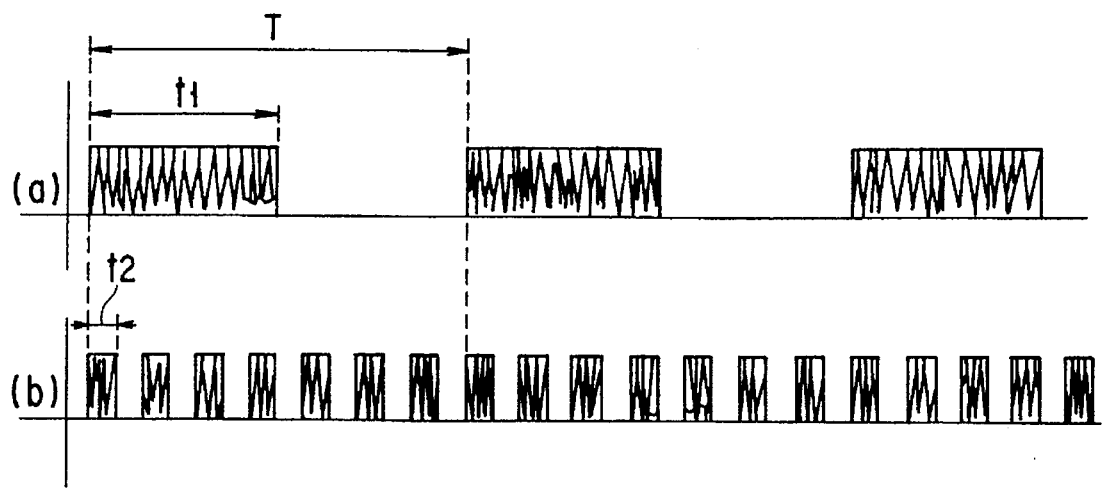
FIG. 6 is a timing chart showing the mode of applied pulses of an RF power for plasma generation.

FIG. 6 is a timing chart showing the mode of application pulses of an RF voltage for plasma generation.

In the above-described etching method for the dipole ring type apparatus shown in FIG. 1, the residence time of a processing gas is set to, e.g., 28 msec or less, as shown in FIG. 5. In the etching method to be described below, however, the sum of pulse width times within the residence time of a processing gas is set to, e.g., 28 msec or less. With this setting, the discharge duration is shortened to suppress the progress of dissociation, thereby increase the content of radicals such as $C_2F_4$ having a high selection ratio. That is, the etching selection ratio at a shoulder portion can be set to 10 or more which is the target value.

In this description, a pulse does not mean an RF single wave but a set of continuous single waves, as shown in FIG. 6. The number of pulses existing in the residence time of a processing gas is set to one or more.

In FIG. 6, (a) shows an example in which a single pulse having a pulse width t1 of 28 msec is applied within a long gas residence time T of more than 28 msec. The pulse width t1 is not limited to 28 msec and may be a smaller value. In FIG. 6, (b) shows an example in which 7 pulses each having a pulse width t2 of 4 msec are applied within the gas residence time T to obtain the total of 28 msec discharge duration.

In this manner, an RF voltage for plasma generation is applied in pulsation to set the discharge duration to a predetermined value, e.g., 28 msec or less, thereby increasing the content of radicals having a high selection ratio. Therefore, the selection ratio can be greatly increased at a shoulder portion.

Temperature management of a target object is important for performing processing for a high etching selection ratio ($SiO_2$/SiN). Processing for a high etching selection ratio can be performed by heating the wafer W to 80° C. to 150°C., and preferably to about 140° C. (temperature of the surface to be processed).

In each processing method described above, a gas mixture, containing $C_4F_8$ and CO as etching gases, and Ar as an inert gas, is used. Even if a gas mixture containing only $C_4F_8$ and CO is used instead of this, $SiO_2$ can be selectively etched with respect to SiN. Also in this case, the wafer W is heated to 80° to 150° C., and preferably to about 140° C. and kept at that temperature.

A processing method of adjusting the CO amount in a processing gas or the temperature of a lower electrode to control the etching selection ratio will be described below.

From the results of experiments by the present inventors, it was found that the etching selection ratio ($SiO_2$/SiN) at the flat portion and that at the corner portion 5a exhibited reverse tendencies by changing the CO supply rate and the temperature of the lower electrode among the process conditions.

FIGS. 8 and 9 are graphs showing experimental results in the dipole ring type apparatus shown in FIG. 1. In the experiments related to FIGS. 8 and 9, the etching pressure was set at 40 mTorr; the RF power, 1,700 W; and the temperatures of the ceiling portion and side wall of the processing chamber 16, 60° C.

In the experiments related to FIG. 8, a gas mixture of $C_4F_8$/CO/Ar was used as a processing gas, the $C_4F_8$/Ar flow rate was set at 20/400 (SCCM), and the temperature of the susceptor 24 was set at 20° C. The CO supply rate was changed to check the relationship between the CO supply rate and the etching selection ratio ($SiO_2$/SiN). In FIG. 8, lines L5, L6, and L7 indicate the etching selection ratio at a shoulder portion, that at a flat portion, and the $SiO_2$ etching rate. As shown in FIG. 8, with an increase in CO supply rate, the selection ratio at the shoulder portion slightly decreased, but that at the flat portion greatly increased. That is, it is found that the CO rate is decreased at the $C_4F_8$/CO supply rate falling within a range of 2/25 to 2/35 to increase the etching selection ratio at the shoulder portion.

In the experiments related to FIG. 9, a gas mixture of $C_4F_8$/CO/Ar was used as a processing gas, and the $C_4F_8$/CO/Ar flow rate was set at 20/250/400 (SCCM). The temperature of the lower electrode was changed to check the relationship between the temperature of the lower electrode and the etching selection ratio ($SiO_2$/SiN). In FIG. 9, lines L8, L9, and L10 indicate the etching selection ratio at a shoulder portion, that at a flat portion, and the $SiO_2$ etching rate. Figures in parentheses below the temperatures along the abscissa indicate the temperatures of the target surface of the wafer W. As shown in FIG. 9, with an increase in temperature of the lower electrode, the selection ratio at the shoulder portion is greatly increased, but that at the flat portion is slightly decreased. Therefore, the selection ratio at the shoulder portion can be further increased by increasing the temperature of the lower electrode to a certain degree, e.g., 20° C. or more (the temperature of the target surface of the wafer W is 120° C. or more at this time).

Figure 10:
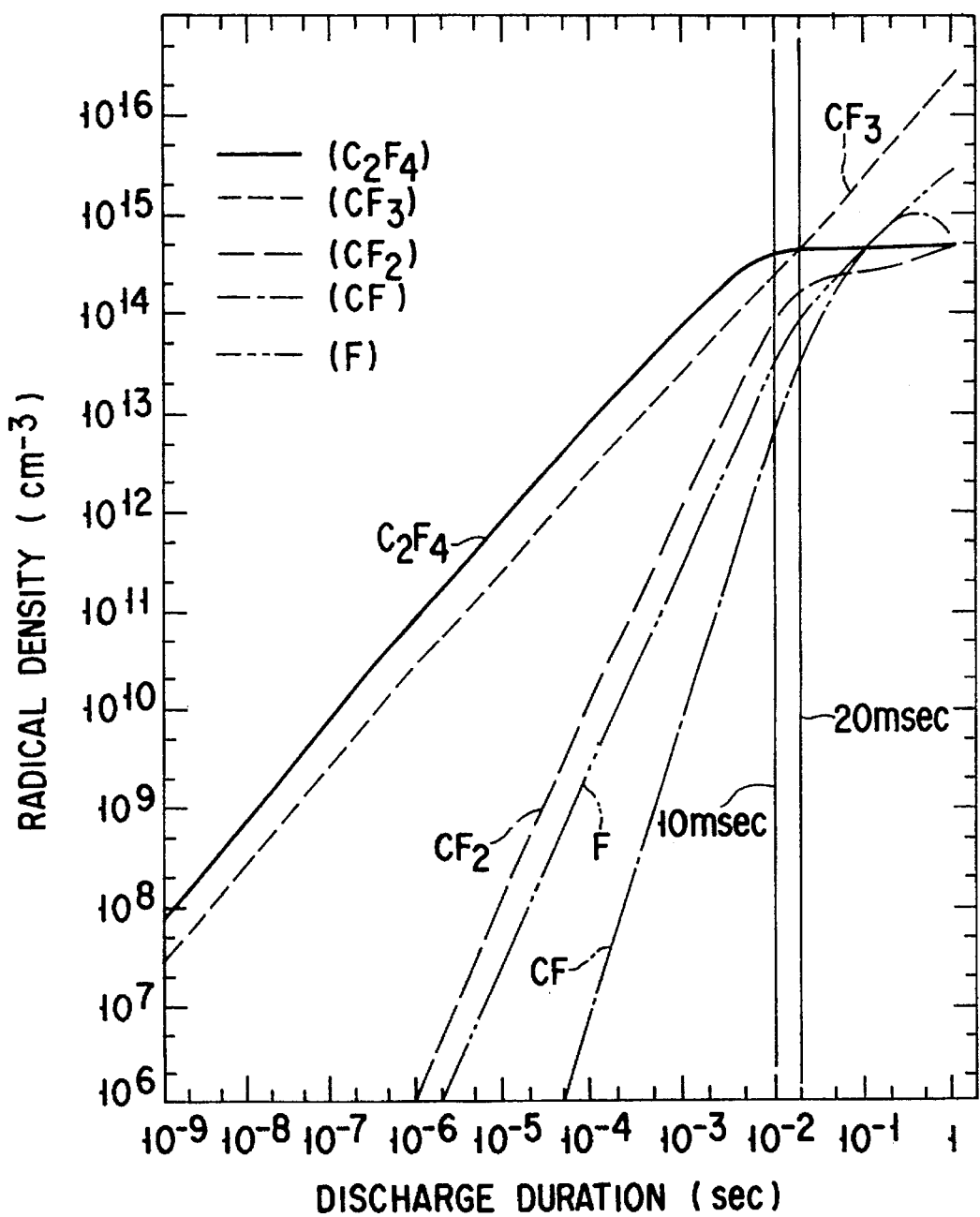
FIG. 10 is a graph showing the results of a simulation of the relationship between the discharge duration (sec) and the radical density ($cm^{-3}$).

FIG. 10 is a graph showing the results of a simulation of the relationship between the discharge duration (sec) and the density ($cm^{-3}$) of radials produced by dissociation of $C_4F_8$. This simulation is based on a condition that an energy of 20 eV is applied to $C_4F_8$ gas by discharge.

In FIG. 10, giving attention to the density relationship between $C_2F_4$ and $CF_3$ which influences most the etching selection ratio ($SiO_2$/SiN), the $CF_3$ density exceeds the $C_2F_4$ density at a discharge duration of about 20 msec or more, while the $C_2F_4$ density does not increase at a discharge duration of about 10 msec or more. From these results, it is found that the density of $C_2F_4$ itself and the relative density relationship of $C_2F_4$ and $CF_3$ can be controlled by adjusting the discharge duration.

In the present invention, to set the etching selection ratio ($SiO_2$/SiN) high, it is preferable to perform etching for a discharge duration not longer than the discharge duration (about 20 msec in this simulation) at which the density ratio ($C_2F_4$/$CF_3$) becomes 1. Further, it is more preferable to perform etching for a discharge duration not longer than the discharge duration (about 10 msec in this simulation) corresponding to the point of inflection of the density curve where the density of $C_2F_4$ itself does not increase.

As has been described above, according to the present invention, the density ratio of $C_2F_4$ to $CF_3$ which are generated upon dissociation of $C_4F_8$ can be controlled by changing the discharge duration. More specifically, to set the etching selection ratio of an $SiO_2$ layer serving as an etching target layer to an SiN layer serving as an underlayer, a preferable value is selected for the discharge duration of each part of a processing gas as a parameter. If a plurality of wafers W are continuously processed, a plasma etching apparatus is set in accordance with a selected parameter value before processing the lot of the wafers W. In general, selected parameter values are input, to the CPU 13 shown in FIG. 1 or 3, as more detailed values such as the exhaust amount of a processing room, the supply rate (residence time) of a processing gas, and the mode of application of an RF power (in continuation or pulsation). During etching, the CPU 13 controls the control sections 34 and 78 so as to keep the input set values.

Although an SiN underlayer has been exemplified in the above processing methods, the same effect can be obtained in the present invention even if an underlayer consists of another material such as Si, Al, TiN, W, WSi, or TiSi. In addition, although Ar is used as a carrier gas for a processing gas, another inert gas such as He gas can be used instead of the Ar gas.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A plasma etching method in which a processing gas is introduced into a processing room housing a substrate, an RF power is applied across opposite electrodes to cause the processing gas to discharge, thereby generating a plasma, and a first layer supported by said substrate is etched by using the plasma in preference to a second layer supported by said substrate and consisting of a material different from that of said first layer, wherein said first layer consists essentially of $SiO_2$ while second layer consists essentially of a material selected from a group consisting of SiN, Si, Al, and TiN, the processing gas contains $C_4F_8$ and CO, and progress of dissociation of $C_4F_8$ is controlled, using a discharge duration of each part of the processing gas as a parameter, in order to set an etching selection ratio of said first layer to said second layer.

2. The method according to claim 1, wherein the discharge duration is selected to have a small value with a large set value of the etching selection ratio so as to suppress the progress of dissociation and increase a $C_2F_4$ content.

3. The method according to claim 2, wherein said second layer has a shoulder portion while said first layer is arranged on said second layer so as to cover said shoulder portion, and said first layer is etched to form a hole through which said shoulder portion of said second layer is exposed.

4. The method according to claim 2, wherein the RF power is continuously applied, and the discharge duration is defined as a residence time of each part of the processing gas in said processing room.

5. The method according to claim 2, wherein an RF power is applied in pulsation, and the discharge duration is defined as a sum of pulse widths within a residence time of each part of the processing gas in said processing room.

6. The method according to claim 2, wherein said substrate is heated to not less than 120° C. during the etching.

7. A plasma etching method in which a processing gas is introduced into a processing room housing a substrate, an RF power is applied across opposite electrodes to cause the processing gas to discharge, thereby generating a plasma, and a first layer supported by said substrate is etched by using the plasma in preference to a second layer supported by said substrate and consisting of a material different from that of said first layer, wherein said first layer consists essentially of $SiO_2$ while said second layer consists essentially of a material selected from a group consisting of SiN, Si, Al, TiN, W, WSi, and TiSi, the processing gas contains $C_4F_8$ and CO, and a density ratio of $C_2F_4$ and $CF_3$, which are generated upon dissociation of $C_4F_8$, is controlled, using a discharge duration of each part of the processing gas as a parameter, in order to set an etching selection ratio of said first layer to said second layer.

8. The method according to claim 7, wherein the discharge duration is selected to have a value so as to set the density ratio of $C_2F_4/CF_3$ to be not less than 1, and to have a small value with a large set value of the etching selection ratio so as to increase the density ratio.

9. The method according to claim 8, wherein said second layer has a shoulder portion while said first layer is arranged on said second layer so as to cover said shoulder portion, and said first layer is etched to form a hole through which said shoulder portion of said second layer is exposed.

10. The method according to claim 8, wherein the RF power is continuously applied, and the discharge duration is defined as a residence time of each part of the processing gas in said processing room.

11. The method according to claim 8, wherein an RF power is applied in pulsation, and the discharge duration is defined as a sum of pulse widths within a residence time of each part of the processing gas in said processing room.

12. The method according to claim 8, wherein said substrate is heated to 80° C. to 150° C. during the etching.

13. A plasma etching method using a plasma etching apparatus in which a first layer supported by a substrate is etched in preference to a second layer supported by said substrate and consisting of a material different from that of said first layer, wherein said apparatus comprises a first electrode for supporting said substrate in a processing room, a second electrode opposite to said first electrode in said processing room, and an RF power supply for applying an RF power across said first and second electrodes, and wherein said first layer consists essentially of $SiO_2$ while said second layer consists essentially of a material selected from a group consisting of SiN, Si, Al, TiN, W, WSi, and TiSi, the processing gas contains $C_4F_8$ and CO, said method comprising the steps of:

selecting a value for a discharge duration of each part of a processing gas as a parameter in order to set an etching selection ratio of said first layer to said second layer, a density ratio of $C_2F_4$ to $CF_3$, which are generated upon dissociation of $C_4F_8$, being controlled by changing the discharge duration;

setting said plasma etching apparatus in accordance with the selected value of the parameter;

supporting said substrate by said first electrode;

supplying the processing gas into said processing room while exhausting said processing room, the processing gas containing $C_4F_8$ and CO;

applying the RF power across said first and second electrodes to convert the processing gas into a plasma; and processing said first and second layers using the plasma.

14. The method according to claim 13, wherein the discharge duration is selected to have a value so as to set the density ratio of $C_2F_4/CF_3$ to be not less than 1, and to have a small value with a large set value of the etching selection ratio so as to increase the density ratio.

15. The method according to claim 14, wherein said second layer has a shoulder portion while said first layer is arranged on said second layer so as to cover said shoulder portion, and said first layer is etched to form a hole through which said shoulder portion of said second layer is exposed.

16. The method according to claim 14, wherein the RF power is continuously applied, and the discharge duration is defined as a residence time of each part of the processing gas in said processing room.

17. The method according to claim 14, wherein an RF power is applied in pulsation, and the discharge duration is defined as a sum of pulse widths within a residence time of each part of the processing gas in said processing room.

18. The method according to claim 14, wherein said substrate is heated to 80° C. to 150° C. during the etching.

* * * * *